United States Patent [19]

Osman

[11] Patent Number: 4,493,055
[45] Date of Patent: Jan. 8, 1985

[54] WAFER-SCALE INTEGRATED CIRCUITS

[75] Inventor: Ismet M. F. M. Osman, San Diego, Calif.

[73] Assignee: Burroughs Corp., Detroit, Mich.

[21] Appl. No.: 330,539

[22] Filed: Dec. 14, 1981

[30] Foreign Application Priority Data

Dec. 12, 1980 [GB] United Kingdom ............... 8039902

[51] Int. Cl.³ .................. G11C 7/00; G11C 19/00
[52] U.S. Cl. ..................... 365/78; 365/174; 365/220; 377/64; 377/77
[58] Field of Search ............ 365/78, 75, 174, 240; 307/238.1, 238.6, 238.4; 377/64, 77

[56] References Cited

U.S. PATENT DOCUMENTS 3,913,072 10/1975 Catt .
3,972,031 7/1976 Riemenschneider et al. ........ 365/78
4,229,699 10/1980 Frissell .

FOREIGN PATENT DOCUMENTS 2021825 5/1979 United Kingdom .
2035637 6/1980 United Kingdom ............... 365/78

Primary Examiner—Robert L. Richardson
Attorney, Agent, or Firm—Mark T. Starr; Edmund M. Chung; Kevin R. Peterson

[57] ABSTRACT

A wafer-scale integrated circuit wherein a plurality of memory cells on a wafer are connectable from a port to form a chain memory looping away from and back to the port by means of a serial connection of forward moving data registers and a serial connection of backward moving data registers between cells, has a reduced risk of any individual, otherwise functional cell being non-functional as a result of a failure elsewhere on the wafer of an associated global signal line by achieving a reduction in the numbers of global lines by providing the clock signal for controlling the shifting of data in the registers between the cells in parallel with the data, the inter-cell clock operating a multiple clock pulse generator in each cell.

22 Claims, 5 Drawing Figures

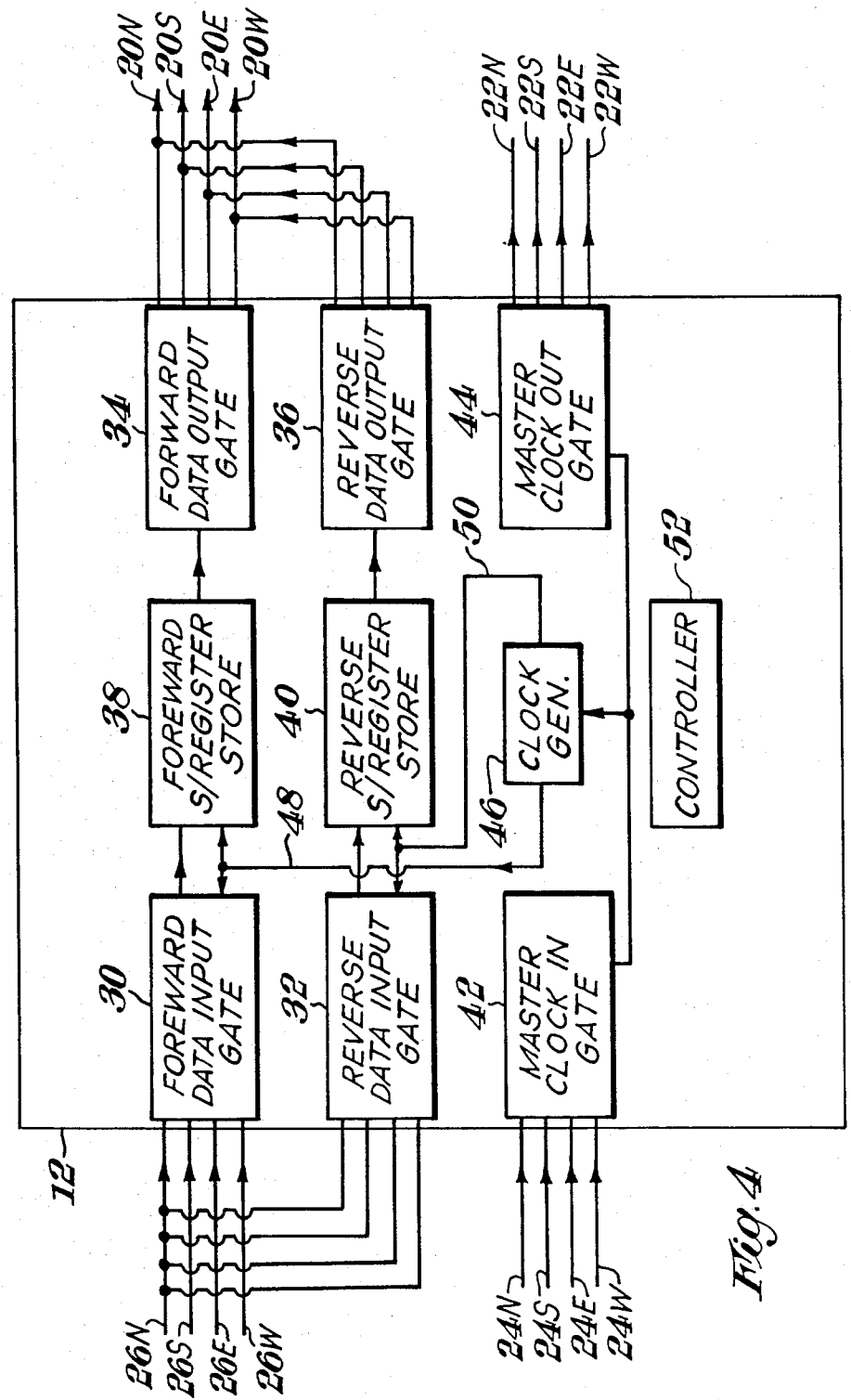

WAFER-SCALE INTEGRATED CIRCUITS

BACKGROUND TO THE INVENTION

1. The Field of the Invention

The present invention relates to wafer-scale integrated circuits where one or more ports are provided together with a plurality of data processing cells on a semiconductor wafer substrate. In particular, the present invention relates to a method and apparatus for distributing control signals to the cells.

2. The Prior Art

The wafer whereon the cells and port or ports are fabricated is generally several inches in diameter. In order that the cell fabrication failure rate may be accomodated on the wafer, the interconnection between the cells is left indeterminate, each cell being provided with means whereby it can be coupled to any selectable neighbouring cell. Starting at one or more of the ports, cells adjacent to the port or ports are tested and, if functional, coupled to the port or ports. Thereafter the the coupled cell or cells couple to and test neighbouring cells which are similarly incorporated if they prove functional. Cells which do not pass the functional test are not coupled into the overall function of the circuit, other functional cells being found to take their places. At the end of the test and coupling process one or more data processing chains of cells is established across the face of the wafer-scale integrated circuit.

A cell may fail its functional testing because of a fabrication fault peculiar to that cell. This kind of fault is well known in integrated circuit fabrication where the result is a rejected chip prior to packaging. In the case of wafer scale integrated circuits the consequences can be more serious.

It is in the nature of wafer scale integrated circuits that certain signals are propagated between cells and certain signals are common to all cells. For example, data signals are generally propagated from one particular cell to another, while the power supply and clock synchronisation signals are generally common to all cells. The common signals are generically known as Global signals and are distributed about the wafer scale circuit on Global lines.

A fault on a Global line can effect more than one cell. For example, a broken or short circuit power supply line can disable not only that cell where the fault physically occurs but also many adjacent cells also dependent upon that particular line for their power supply.

Various schemes have been proposed whereby the effects of Global line faults can be reduced. In particular, power lines can be prevented from disabling more than one cell in the presence of a short circuit by the inclusion therein of fusible isolation links which melt when they carry excess current. Such measures are acceptable in lines carrying sufficient power to melt links and the like, but in the case of other Global signal lines there is not the energy available to achieve such protection.

It is therefore desirable, in order to maximize the number of functionally useful cells on a wafer scale integrated circuit, to maximize the number of low-power Global signal lines thereon.

SUMMARY OF THE INVENTION

The present invention consists in an integrated circuit including a data port and a plurality of data processing cells on a semiconducting wafer, at least some of said cells being connectible to neighbouring cells for data transfer to form a chain of cells starting at said port, the transfer of said data between said cells in said chain being controlled by a clock signal which is propagated from cell to cell in said chain along the same path as said data.

BRIEF DESCRIPTION OF THE PREFERRED EMBODIMENT

In a preferred embodiment the wafer scale integrated circuit comprises a plurality of shift-register memory storage cells. Starting at a coupling port, the cells are preferably individually accessible for testing and thereafter, if they pass a functional test, are incorporable into a serial shift register memory starting at the port. Each cell, once incorporated into the shift register memory, is preferably operable to couple to a selectable neighbouring cell, provided that cell is not already so incorporated, for the testing and subsequent incorporation of that neighbour into the shift register memory if the neighbouring cell works. The result of this testing and incorporation routine is preferably the establishment of one or more data storage chains on the wafer-scale circuit, the chain or chains starting and ending on the same port or ports. The individual data storage cells preferably comprise a forward data storage shift register and a reverse data storage shift register, in which case data passes through a particular cell from that cell next nearer to the port in a chain via the forward register and back towards the port from that cell next further away in the chain via the reverse register. The data exiting from the forward register in the last cell in the chain preferably loops back into the reverse register of that last cell. The data storage cell which is in receipt of the output of the forward register of a particular cell is preferably the cell which provides the input to the reverse register of that particular cell.

Each cell preferably comprises a clock generation circuit in receipt of a master clock signal from the cell next nearer the port in a chain. The clock generator preferably provides a first clock signal to control the acceptance of data by and movement of data along the forward register and a second clock signal for controlling the acceptance of data by and movement of data along the reverse register.

Each particular cell preferably comprises a data steering circuit for controlling the coupling of data to a selectable one of the neighbouring cells as the next further away cell from the port in a chain, in which case each cell also comprises a clock steering circuit for providing the master clock signal, received by the particular cell from the cell next nearer the port, as the master clock input to the following cell next further from the port in the chain as defined by the data coupling of the steering circuit.

The invention is further explained, by way of an example, by the following description in conjunction with the appended drawings, in which;

BRIEF DESCRIPTION OF THE DRAWINGS

FIG. 4 shows the internal structure of a cell.

DETAILED DESCRIPTION OF THE PREFERRED EMBODIMENT

Figure 1:
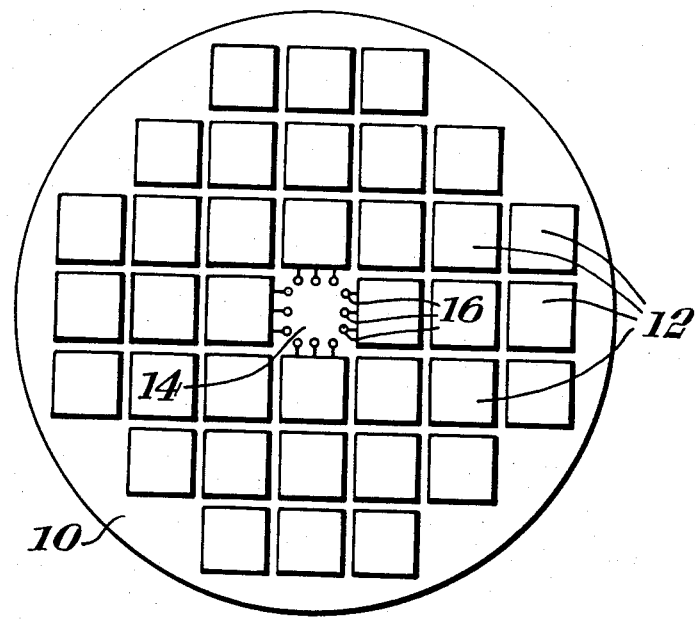
FIG. 1 shows a wafer-scale integrated circuit as it is physically laid out on a semiconducting substrate.

FIG. 1 shows the physical layout of the wafer scale integrated circuit.

A circular, semiconducting wafer substrate 10 has fabricated thereon a plurality of square, shift register data storage cells 12. The cells 12 form a regular tesselation across the surface of the wafer 10 with the exception of the omission of one cell from the the tesselation to form a coupling port 14. The coupling port 14 is preferably but not necessarily at or near the the center of the wafer 10. The cells 12 bordering the coupling port 14 are provided with coupling pads 16 by which they may be connected to the outside world.

The cells 12 are operable to couple to any selectable one neighbouring cell 12 for the transfer of data thereto and therefrom. Starting at the port 14, one of the neighbouring cells 12 to the port 14 is subjected to a functional test from the port 14 via the coupling pads 16. If the cell 12 is functional and therefore passes the functional test, it is instructed to couple to a further neighbouring cell 12 and that further cell 12 is tested.

Figure 2:
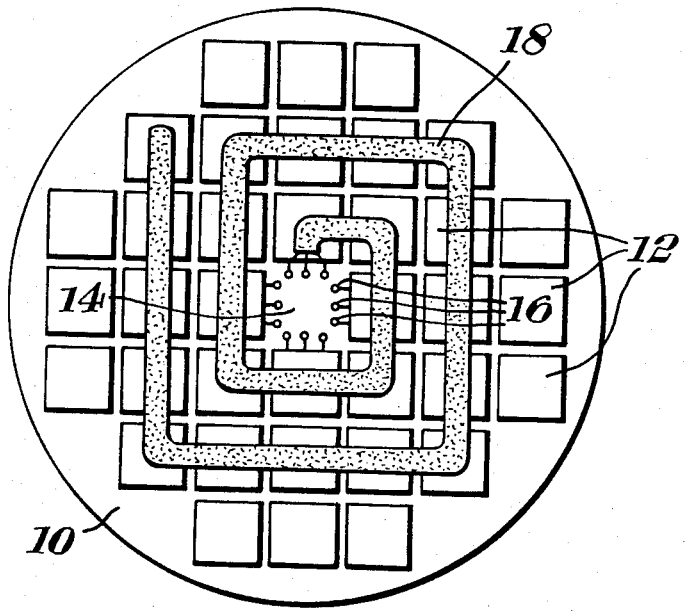
FIG. 2 shows the structure of the chain of individual cells on the wafer.

FIG. 2 shows how the cells 12 can be formed into a data storage chain 18 on the wafer. It is to be understood that cells 12 which do not pass the functional test can be omitted from the chain 18 by its being steered around their positions.

Figure 3:
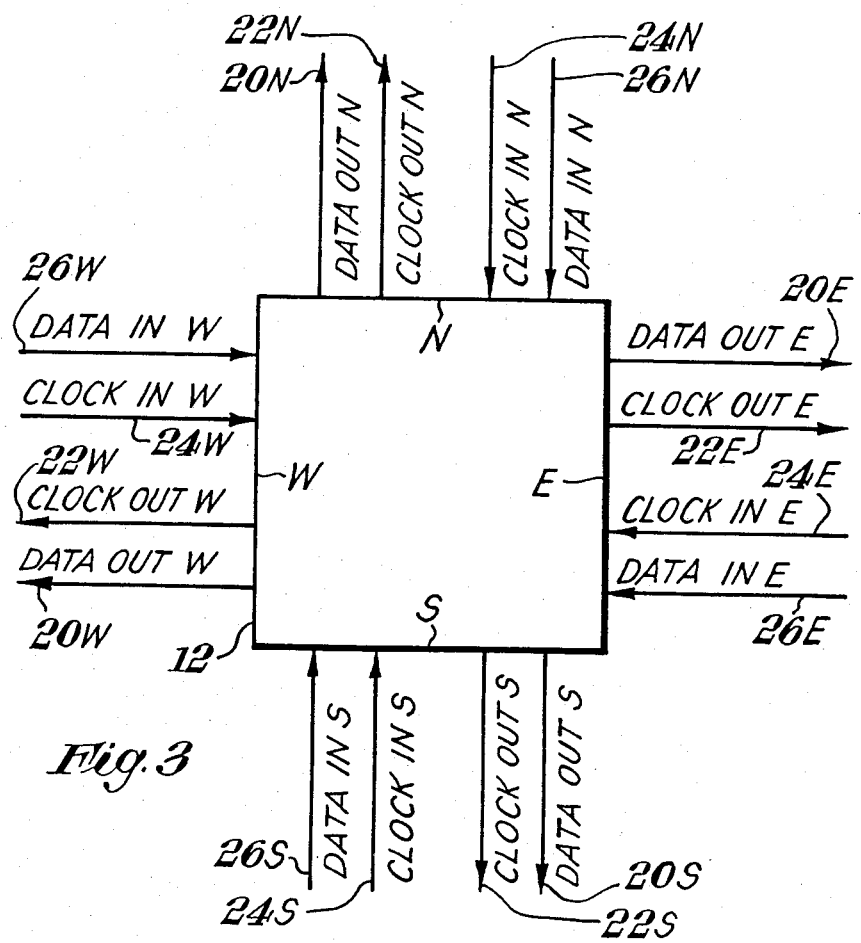
FIG. 3 shows the inter-cell coupling.

FIG. 3 shows the connections on the boundaries of a cell 12.

The square cell 12 has four boundaries, designated the north boundary N, the south boundary S, the east boundary E and the west boundary W. The north boundary N is contiguous with the south boundary S of a first neighbouring cell 12. The east boundary E is contiguous with the west boundary W of a second neighbouring cell 12, the south boundary S is contiguous with the north boundary N of a third neighbouring cell 12 and the west boundary W is contiguous with the east boundary E of a fourth neighbouring cell 12.

Each boundary N, S, E, W has a first line 20N, 20S, 20E, 20W respectively for transferring data out of the cell 12 to a neighbouring cell 12. Each boundary N, S, E, W, has a second line 22N, 22S, 22E, 22W respectively for transferring the master clock signal to a neighbouring cell 12. Each boundary N, S, E, W has a third line 24N, 24S, 24E, 24W respectively for receiving the master clock signal from a neighbouring cell. Each boundary N, S, E, W has a fourth line 26N, 26S, 26E, 26W for receiving data from a neighbouring cell. Table 1 shows the interconnection between the lines shown and the lines on the neighbouring cells.

TABLE 1

| INTER-CELL CONNECTIONS |
| --- |
| 20N joins to 26S of neighbouring cell to North |
| 22N joins to 24S of neighbouring cell to North |
| 24N joins to 22S of neighbouring cell to North |
| 26N joins to 20S of neighbouring cell to North |
| 20E joins to 26W of neighbouring cell to East |
| 22E joins to 24W of neighbouring cell to East |
| 24E joins to 22W of neighbouring cell to East |
| 26E joins to 20W of neighbouring cell to East |
| 20S joins to 26N of neighbouring cell to South |
| 22S joins to 24N of neighbouring cell to South |
| 24S joins to 22N of neighbouring cell to South |
| 26S joins to 20N of neighbouring cell to South |
| 20W joins to 26E of neighbouring cell to West |

TABLE 1-continued

| INTER-CELL CONNECTIONS |
| --- |
| 22W joins to 24E of neighbouring cell to West |
| 24W joins to 22E of neighbouring cell to West |
| 26W joins to 20E of neighbouring cell to West |

It is seen that a cell 12 can pass data and clock signals to and receive data and clock signals from any neighbouring cell 12.

FIG. 4 shows the internal structure of a cell 12.

The input and output lines to the cell 12 are shown dissociated from their associated boundaries N, S, E, W to enhance the clarity of the figure.

The data input lines 26N, 26S, 26E, 26W are provided as the inputs to a forward data input gate 30 and to a reverse data input gate 32. The data output lines 20N, 20S, 20E, 20W are provided as the output of a forward data output gate 34 and of a reverse data output gate 36.

The forward data input gate 30 selects the signal from one of the data input lines 26N, 26S, 26E, 26W for provision as input to a forward data shift register store 38. The reverse data input gate 32 selects the signal from another of the data input lines 26N, 26S, 26E, 26W as the input to a reverse data shift register store 40.

The forward data store 38 and the reverse data store 40 can both be the same length and each comprise a plurality of shift register, bit storage cells coupled in tandem, or they can be of different lengths. After a predetermined number of clock pulses have been applied to a clock input to each of the stores 38, 40, the informational data originally presented at their input reappears at their output. Similarly, the stores 38, 40, according to various proposed and known cell configurations, can be means whereby data can be stored in or retrieved from other, main storage elements in the cell 12 as well as passed through the cell 12 up and down the chain 18.

The output of the forward data store 38 is provided as the input to the forward data output gate 34 which provides the output of the store 38 as the signal on a selectable one of the data output lines 20N, 20S, 20E, 20W. The output of the reverse data store 40 is provided as the input to the reverse data output gate which provides the output of the reverse store 40 as the signal on another selectable one of the data output lines 20N, 20S, 20E, 20W.

The master clock input lines 24N, 24S, 24E, 24W are provided as the inputs to the master clock input gate which provides, as its output, the signal on a selectable one of the lines 24N, 24S, 24E, 24W. The output of the master clock input gate is provided firstly as the input to a master clock output gate 44 which provides, as its output, the signal on its input to a selectable one of the master clock output lines 22N, 22S, 22E, 22W. The output of the master clock input gate 42 is provided secondly as the input to a clock signal generator 46. The clock signal generator 46 generates a first clock signal on a first clock line 48 for controlling the data aquisition activity of the forward data input gate 30 and the data shifting activity of the forward store 38, and a second clock signal on a second clock line 50 for controlling the data aquisition activity of the reverse data input gate 32 and for controlling the data shifting activity of the reverse store 40.

The switching action of the gates 30, 32, 34, 36, 42 and 44 is determined by the state of a controller 52 which is coupled to control each of them to select in the case of the input gates 30, 32, 42, from which line a signal will be received or in the case of the output gates 34, 36, 44 to which line a signal will be delivered up. The exact manner in which the controller 52 receives instructions to be in a particular state does not constitute part of the present invention. The state of the controller 52 can be established via Global control signals, command words intermingled with data, and the like, those skilled in the art being aware of numerous other ways in which this aim can be accomplished.

The switching control action of the controller 52 is shown in table 2. As is seen, at any one time one face N, S, E or W of the cell 12 is selected as the source of forward data, as a source of the master clock signal, and as a sink for the reverse data, and another face N, S, E or W of the cell 12 is chosen as the sink for the forward data, as the sink for the master clock signal, and as the source of the reverse data.

which increases with the distance a cell 12 is away from the last cell 12' in the direction of the port 14.

The clocked forward data, in coming back from the last cell 12', encounters the forward propagated master clock signal not with increasing lateness, as had been the case in the propagation of the data in the forward chain, but with increasing earliness. This lateness and earliness is of course measured with respect to the application of the master clock signal at the port 14 to the first cell 12. By the time the data has arrived back at the port 14 it has caught up all of its delays and the flow of data into and out of the chain 18 at the port takes place as if the clock signal were distributed to the cells 12 in the usual, globally connected way.

The operation of the clocking circuit has here been described with reference to a hypothetically constantly moving data stream up and down the chain 18.

The present invention works equally well in any

TABLE 2

| | INPUT AND OUTPUT ROUTING FUNCTION OF THE CELL (12) | | | | |
|---|---|---|---|---|---|
| SOURCE OF FORWARD DATA INPUT (TO 38) | SOURCE OF MASTER CLOCK INPUT (TO 46,44) | SINK FOR FORWARD DATA OUTPUT (FROM 38) | SOURCE OF REVERSE DATA INPUT (TO 40) | SINK FOR REVERSE DATA OUTPUT (FROM 40) | SINK FOR MASTER CLOCK OUTPUT (FROM 42) |
| 26N | 24N | NOT 20N | NOT 26N | 20N | NOT 22N |
| 26S | 24S | NOT 20S | NOT 26S | 20S | NOT 22S |
| 26E | 24E | NOT 20E | NOT 26E | 20E | NOT 22E |
| 26W | 24W | NOT 20W | NOT 26W | 20W | NOT 22W |
| NOT 26N | NOT 24N | 20N | 26N | NOT 20N | 22N |
| NOT 26S | NOT 24S | 20S | 26S | NOT 20S | 22S |
| NOT 26E | NOT 24E | 20E | 26E | NOT 20E | 22E |
| NOT 26W | NOT 24W | 20W | 26W | NOT 20W | 22W |

Figure 5:
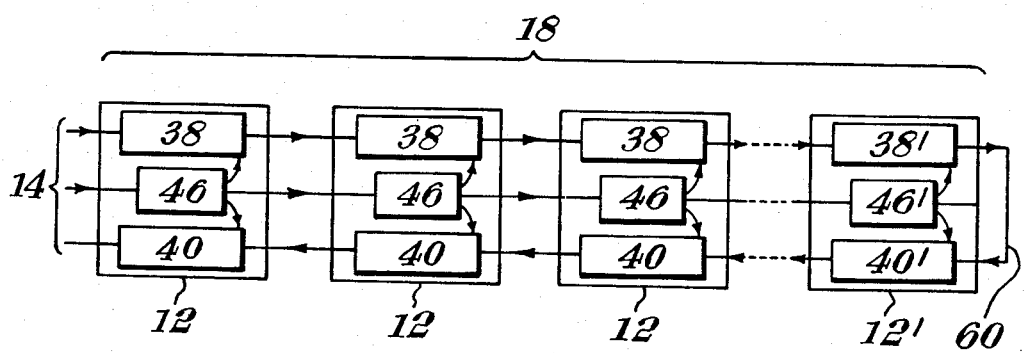
FIG. 5 shows a simplified schematic drawing of the cells coupled in a chain.

FIG. 5 shows a simplified configuration of the memory chain 18 which is formed on the wafer scale circuit.

The forward registers 38 of the cells 12 are coupled in series. The reverse registers 40 of the cells 12 are similarly coupled in series. The chain of forward registers 38 leads data from the port 14 to a last cell 12' and the chain of reverse registers 40' lead data back from the last cell 12' to the port 14. The last cell 12' has a loop data coupling 60 whereby the output of the last cell forward register 38' is provided as the input to the last cell reverse register 40'. All cells 12 have the facility for forming the loop coupling 60, but it is only used in that cell 12' which happens to find itself at the end of the chain.

The master clock signal is coupled from the port 16 from clock generator 46 to clock generator 46 along the chain 18 up to and including the clock generator 46' of the last cell 12'. There being no cell 12 beyond the last cell 12', the propagation of the master clock signal stops thereat.

The master clock signal is passed on by the clock generators 46 from cell 12 to cell, and is subject to a delay between the cells. If the delay in propagating the clock signal between cells 12 is designated by Td, then the clock signal will reach the Nth cell away from the port NTd later than if it had been propagated in the usual manner by parallel Global lines to all cells at the same time. If the last cell 12' is the Mth cell counting from the port 14, then forward data enters the last cell 12' MTd late. However, the same clock signal is used to clock the forward data as is used to control the flow of reverse data. The flow of data, in passing from the forward to the reverse direction, experiences an advance in position relative to the propagated clock signal chain-connectable wafer-scale integrated circuit having a forward data path and a reverse data path. Those skilled in the art will be aware of many variations on this type of chain connectable wafer-scale circuit.

Equally well the present invention might be employed in a wafer-scale circuit wherein data enters a directional chain at one port and leaves at another, the clock signal being propagated therebetween from the data entry port to the data exit port.

The invention equally applies to those circuits where data is propagated only so far down a chain for storage in a selectable cell, and where data is retrieved from storage from a selectable cell in the chain to be propagated back to a port.

It is to be noted that the clock generator 46 can be of any kind consistent with the operation of the particular type of cell in conjunction with which the present invention is applied. In particular, it is advantageous that the clock generator 46 includes clock signal buffering means to prevent progressive attenuation of the master clock signal as it progresses down the chain.

The cells need not be four-sided, nor need the clock and data signals be propagatable across every edge of the cells. The cells need not necessarily be all of the same shape or function. The present invention might equally be used to clock data into and out of, for example, arithmetic units in a wafer scale processor integrated circuit.

What I claim is:

1. An integrated circuit comprising a data port and a plurality of data processing cells on a semiconducting wafer, at least some of said cells being connectable to neighbouring cells for data transfer to form a chain of cells starting at said port, the transfer of data between said cells in said chain being controlled by a clock signal and wherein each of said cells in said chain includes clock signal propagation means for propagating said clock signal from cell to cell along said chain.

2. The integrated circuit according to claim 1 wherein said clock signal propagation means comprises input logic for receiving said clock signal from a first neighbouring cell and output logic for providing said clock signal to a selectable one other neighbouring cell.

3. The integrated circuit according to claim 2 wherein said input logic is operable subsequently to having received said clock signal from said first neighbouring cell to prevent the receipt of said clock signal from any other neighbouring cell.

4. The integrated circuit according to claim 2 wherein each of said cells in said chain further includes a clock generator coupled intermediately between said input logic and said output logic, said clock generator being operable to receive said clock signal from said input logic, to pass on said clock signal to said output logic and, in response to said clock signal from said input logic, to generate one or more internal clock signals for use within said each one of said cells in said chain.

5. The integrated circuit according to claim 4 wherein each one of said cells in said chain further includes a first data path for receiving data from said first neighbouring cell and passing said data received from said first neighbouring cell to said selected one other neighbouring cell and a second data path for receiving data from said selected one other neighbouring cell and for passing said data from said selected one other neighbouring cell to said first neighbouring cell.

6. The integrated circuit according to claim 5 wherein said clock generator comprises a first clock generator for providing a first internal clock signal for controlling the movement of said data in said first data path and a second clock generator for providing a second internal clock signal for controlling the movement of said data in said second data path.

7. The integrated circuit according to claim 6 wherein said first data path comprises a first data storage shift register and wherein said second data path comprises a second data-storage shift register.

8. The integrated circuit according claim 4 or 6 or 7 wherein said input logic is operable subsequently to having received said clock signal from said first neighbouring cell to prevent the receipt of said clock signal from any other neighbouring cell.

9. The integrated circuit according to claim 5 or 6 or 7 wherein said each one of said cells in said chain further includes wrap-around logic operable in default of a command to said output logic to provide said clock signal to a selectable other neighbouring cell to couple the output of said first data path as the input to said second data path.

10. The integrated circuit according to claim 8 wherein said cells are square and form a regular tesselation on said wafer.

11. The integrated circuit according to claim 9 wherein said port is formed by the omission of one of said cells from said tesselation and the provision of coupling to one or more of the cells adjacent thereto.

12. A circuit comprising:
a data port; and
a plurality of data processing cells, at least some of said cells being connectable to neighbouring cells for data transfer to form a chain of cells starting at said port, the transfer of data between said cells in said chain being controlled by a clock signal, each of said cells in said chain including
clock signal propagation means for propagating said clock signal from cell to cell along said chain, said clock signal propagation means including input logic for receiving said clock signal from a first neighbouring cell and output logic for providing said clock signal to a selectable one other neighbouring cell,
and a clock generator coupled intermediately between said input logic and said output logic, said clock generator being operable to receive said clock signal from said input logic, to pass on said clock signal to said output logic and, in response to said clock signal from said input logic, to generate one or more internal clock signals for use within said each one of the cells in said chain.

13. The circuit according to claim 12 wherein said circuit is an integrated circuit and said plurality of data processing cells are on a semiconducting wafer.

14. The circuit according to claim 12 wherein said input logic is operable subsequently to having received said clock signal from said first neighbouring cell to prevent the receipt of said clock signal from any other neighbouring cell.

15. The circuit according to claim 12 wherein each one of said cells in said chain further includes a first data path for receiving data from said first neighbouring cell and passing said data received from said first neighbouring cell to said selected one other neighbouring cell and a second data path for receiving data from said selected one other neighbouring cell and for passing said data from said selected one other neighbouring cell to said first neighbouring cell.

16. The circuit according to claim 15 wherein said clock generator comprises a first clock generator for providing a first internal clock signal for controlling the movement of said data in said first data path and a second clock generator for providing a second internal clock signal for controlling the movement of said data in said second data path.

17. The circuit according to claim 16 wherein said first data path comprises a first data storage shift register and wherein said second data path comprises a second data-storage shift register.

18. The circuit according to claim 15 or 16 or 17 wherein said each one of said cells in said chain further includes wrap-around logic operable in default of a command to said output logic to provide said clock signal to a selectable other neighbouring cell to couple the output of said first data path as the input to said second data path.

19. The circuit according to claim 18 wherein said circuit is an integrated circuit, said plurality of cells are on a semiconducting wafer, and said cells are square and form a regular tesselation on said wafer.

20. The circuit according to claim 19 wherein said port is formed by the omission of one of said cells from said tesselation and the provision of coupling to one or more of the cells adjacent thereto.

21. The circuit according to claim 15 or 17 wherein said circuit is an integrated circuit and said plurality of data processing cells are on a semiconducting wafer.

22. The circuit according to claim 18 wherein said input logic is operable subsequently to having received said clock signal from said first neighbouring cell to prevent the receipt of said clock signal from any other neighbouring cell.

* * * * *